United States Patent [19]

Cunningham et al.

[11] 4,401,941

[45] Aug. 30, 1983

[54] FLANGE AND CASING CHECKING INSTRUMENT

[75] Inventors: William E. Cunningham, Rte. 3, Seymour, Mo. 65746; Orvin D. Simpson, Springfield, Mo.

[73] Assignee: William E. Cunningham

[21] Appl. No.: 327,679

[22] Filed: Dec. 4, 1981

[51] Int. Cl.³ .............................................. G01R 31/02
[52] U.S. Cl. ...................................................... 324/54
[58] Field of Search ........................ 324/54, 51, 65 CR

[56] References Cited

U.S. PATENT DOCUMENTS 4,051,436  9/1977  Weir, Jr. ................. 324/65 CR UX
4,335,348  1/1982  Reed et al. ............................ 324/51

FOREIGN PATENT DOCUMENTS 53-93392  8/1978  Japan ..................................... 324/54
54-105596  8/1979  Japan ............................. 324/65 CR Primary Examiner—Stanley T. Krawczewicz
Attorney, Agent, or Firm—D. Paul Weaver

[57] ABSTRACT

A flange and casing insulation testing instrument, comprising a means to apply a small voltage across a pair of insulated pipe flanges or between an insulated pipe and casing in an environment of earth and ground moisture to effect an electrolysis charging between the two components. First and second timers are provided to record the time period required to effect charging to a predetermined level to allow the establishment of a data base relating to the system being monitored. A microammeter provides an indication of the state of the insulation between the elements of the system, i.e. if the flanges or pipe and casing are shorted together, there will be no residual charge.

10 Claims, 4 Drawing Figures

FLANGE AND CASING CHECKING INSTRUMENT

THE INVENTION

This invention relates to a means to determine the status of insulation between two electrical conductors such as pipe flanges or pipes and pipe casings in a ground environment by attempting to place a charge between the conductors by electrolysis.

BACKGROUND OF THE INVENTION

Modern technology has produced a demand for a number of substances which may be transported via pipe lines. This has resulted in the development of technology for constructing pipe lines underground so they will have a minimal ecological impact and will not pose problems for surface transportation systems such as railroads or highways.

A majority of underground pipe lines use metallic pipes with protective outer casings in areas of abnormal mechanical stress such as under road beds. The pipe segments and protective casings in metallic lines are generally constructed of iron or steel and they have a tendency to corrode in the underground environment. During the normal corrosion process, a negative voltage of about 650 millivolts is created. This corrosion can be avoided however if a negative potential of approximately 850 millivolts is applied to the pipe line elements. It is imperative that all of the conductive surfaces of the pipe line be maintained at a negative potential greater than the normal corrosion potential if the corrosion process is to be stopped. To ensure the accurate maintenance of the required potential on the pipe line elements, pipe segments are insulated from each other by insulating members positioned between coupling flanges and protective casings are insulated from the primary pipe line by insulating spacers.

Circuit connecting wires are connected to each side of the coupling flanges and these two electrical connections are used to check the insulation between flanges as well as to take readings of the protective voltages. The wires are usually connected between the pipe flanges and check boxes located above the flanges at the top of the earth surface. Each connection is measured at this point and the measurement is usually against a copper sulfate cell.

If the insulated flanges are shorted together due to a lightning discharge in the immediate vicinity or because of mechanical movement, it is extremely difficult to determine that a short has occurred because the electrical resistance of the individual elements of the pipe is extremely low and the cathodic or protective voltage on adjoining flanges is the same.

The electrical resistance of the metallic pipe is so small that it is virtually impossible, with known measuring apparatus, to accurately determine where adjacent pipes are shorted together. The problem is further complicated, since other pipes and insulators either in series or parallel are interconnected with the pipe under study, thus forming additional short circuits around an insulator of interest. For numerous safety reasons, it is imperative that the insulation between flanges and pipes and casings and pipes remain in a servicable condition and that the insulators be replaced when a breakdown results in shorts between elements. Because the pipe systems are underground, visual inspection of the insulation means is precluded and as previously stated, electrical checking of the insulation is hampered by the identical cathodic voltages applied to the elements.

In addition to corrosion problems encountered in primary undergound supplied pipe lines, serious corrosion problems exist in feeder lines coupling major lines to individual users. For instance, gas meter installations at user destinations are insulated from the gas distribution line to eliminate their direct electrical connection to water or electrical services which are connected to ground thru appliances or thru grounding means. The gas service is connected to the main distribution gas line which is protected by the use of a cathodic voltage of approximately 850 millivolts. Thus if the insulator between the feeder gas line and meter is shorted out, a direct short occurs to the water or electrical ground circuit. This shorts out the 850 millivolt cathodic potential on the gas line. The water line is normally not protected by a cathodic voltage and if it is copper, the normal rust voltage of 650 volts is much lower and this will destroy an iron or steel line fairly rapidly.

OBJECTIVES OF THE INVENTION

In view of the numerous difficulties in monitoring the insulation between elements in underground pipe lines, it is a primary objective of the present invention to provide a means whereby electrical insulation between conductors may be tested both quantitatively and qualitatively by using underground moisture as an electrolyte.

A further objective of the present invention is to provide a means whereby a differential electrical charge may be created by electrolysis between two electrical conductors in an underground environment and the resulting residual charge measured.

A still further objective of the present invention is to provide a means to measure the duration of time required to place a predetermined charge across a pair of electrical conductors in an electrolyte environment.

Another objective of the present invention is to provide a means to determine the time required to discharge a potential established between two electrical conductors in an electrolytical environment.

The foregoing and other objectives of the invention will become apparent in light of the drawings, specification and claims contained herein.

SUMMARY OF THE INVENTION

The invention presented hereby provides a means for determining the status of electrical insulation between conductive elements of an underground pipe line by applying a small voltage differential across adjacent pipe line elements. The small potential is maintained for a brief period of time such as one minute and this causes the pipe line elements subjected to the potential to charge up to a voltage higher than the 850 millivolt cathodic voltage in a fashion similar to that experienced by a storage battery, that is via chemical action in an electrolyte. In this sense the electrolyte is ground water or moisture surrounding the pipe elements.

The charging voltage is removed from the adjacent pipe elements and replaced by a microammeter which measures the potential difference between the adjacent pipe elements. The amount of current flow indicated by the meter and the relationship between charging time and discharging time is indicative of the condition of the electrolyte surrounding the pipe and the insulator between the flanges of adjacent pipe sections or between the pipe and protective casing. If the insulator is shorted, no differential voltage will be created and thus no charging effect will occur and no current flow can be measured between adjacent pipe elements. Thus a zero meter reading after application of a testing voltage will be indicative of a shorted insulator.

The general condition of the insulator may also be monitored by establishing a charge time vs discharge time profile for each insulator in a pipe string and periodically testing the insulators and comparing the charge time/discharge time to the established profiles.

DESCRIPTION OF THE INVENTION

Figure 1:
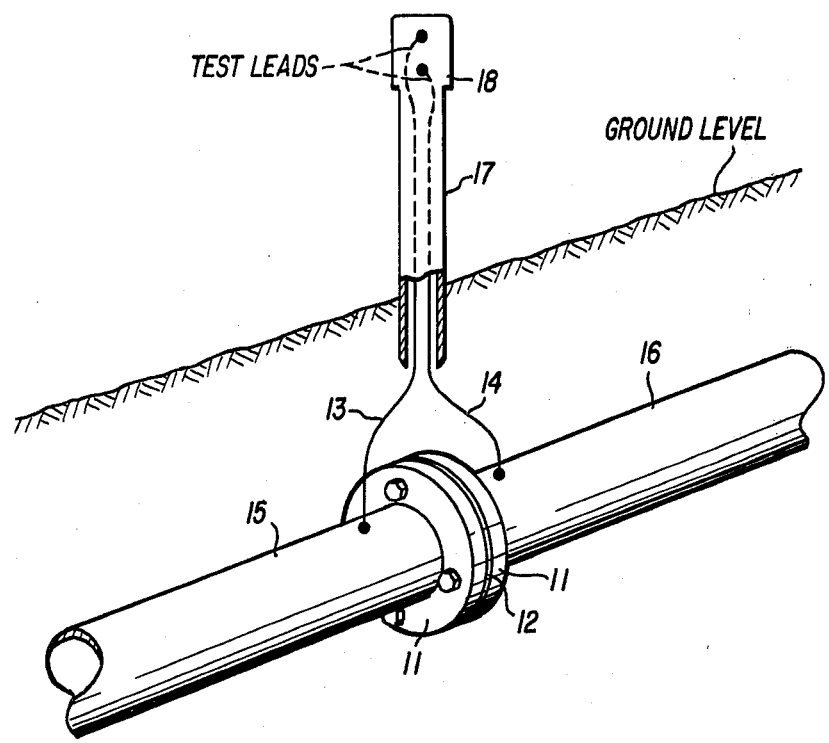
FIG. 1 illustrates a typical pipe line coupling with an insulating member between flanges.

FIG. 1 illustrates a typical pipe line installation in which coupling flanges 11 are separated by an insulating gasket 12. Test leads 13 and 14 are electrically bonded to the adjacent pipe segments 15 and 16 and carried above ground via conduit 17 to where they are terminated in a test receptacle 18 which provides a means to couple the test circuit of the present invention to the pipe line.

Figure 2:
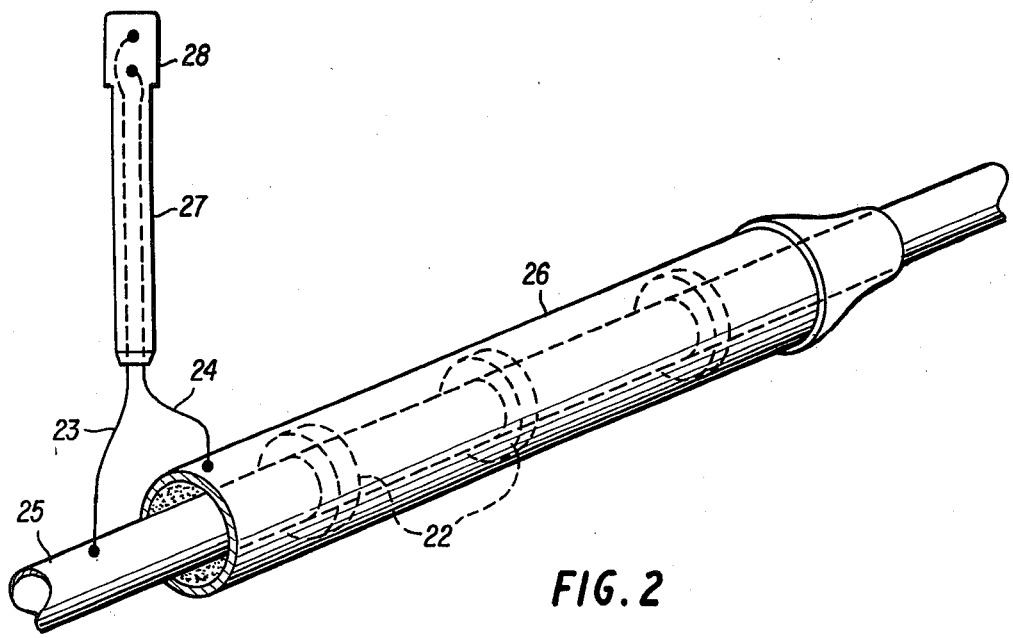
FIG. 2 illustrates an underground pipe line with a protective steel casing.

FIG. 2 illustrates a typical pipe line installation which may be tested by the subject invention wherein a conductive pipe 25 passes thru a steel protective casing 26. The pipe is supported within the casing by insulating spacers 22. Test lead 23 is electrically bonded to pipe 25 and test lead 24 is electrically bonded to the protective casing 26. Both test leads pass thru a protective conduit 27 to a test receptacle 28 which provides a means whereby electrical test equipment may be coupled to the underground components of the pipe string as in FIG. 1 above.

Figure 3:
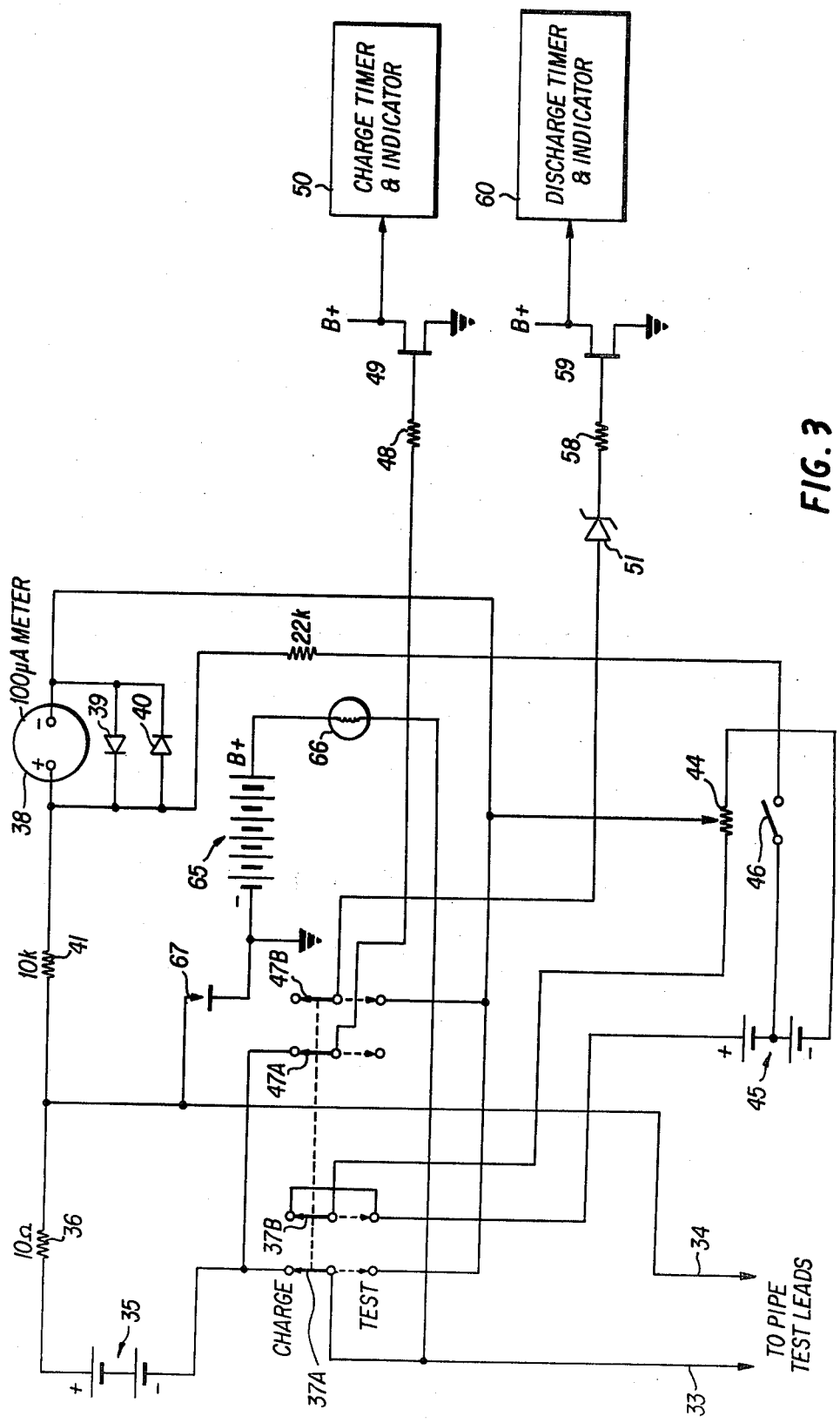
FIG. 3 is an electrical schematic of the invention.

FIG. 3 schematically illustrates the basic electronic circuit utilized in the test system presented herein. In operation, test leads 33 and 34 are coupled to the elements being tested such as the pipe string of FIG. 1 or the pipe and protective casing of FIG. 2. In the illustrated embodiments, test connection receptacles 18 and 28 are provided to accomplish this electrical connection but it should be understood that in certain environments test leads 33 and 34 may be provided with means to directly engage the items being tested.

A low voltage DC power source 35 provides a charging potential to the pipe string being tested via test leads 33 and 34. In the illustrated embodiment, the positive side of the voltage source 35 is coupled directly to a pipe string element via a resistor 36 and test lead 34 and the negative side of the power source 35 is coupled via switch 37A, one half of a double-pole double-throw toggle switch, to test lead 33. A 100 microammeter 38 is electrically connected, via switch 37A, across test leads 33 and 34 so the potential across the insulating means separating the two pipe string elements being tested may be monitored.

A pair of oppositely poled diodes 39 and 40 are connected in parallel to microammeter 38 to provide a means to protect the meter from excessive voltage surges.

In operation, switch 37A is placed in the charge position for a brief interval of time, such as one minute. This electrically connects the power source 35 to the two pipe string elements and they are electrically charged to some potential as a function of the electrolytical properties of the ground moisture surrounding the underground elements. Switch 37A is then placed in the test position and the power source 35 is disconnected from the underground elements and microammeter 38 is connected to the circuit in its place. The potential to which the underground elements were charged is then discharged thru the 10,000 resistor 41 and the current flow occurring during this discharge may be monitored on microammeter 38. Thus if the insulating means between the two underground elements is functioning properly, a differential charge will result due to the charging step and the voltage thus created will result in current flow thru the meter that may be observed during the testing step. If the insulating member is shorted, no charging will occur and therefore no discharging will be noted by the meter, signifying a short in the pipe string.

Many underground pipe lines incorporate cathodic voltage protective means whereby a relatively small potential is applied to each conductive pipe line element. To compensate for this potential, a means to bias microammeter 38 is provided. This bias means is in the form of potentiometer 44 which, selectively applies a controlled bias voltage from power source 45 via switch 37B. Switches 37A and 37B are a double-pole double-throw toggle switch which has a center, off position. If microammeter 38 is indicating a current flow with switch 37B in the off position, it is indicative of the existence of a protective voltage in the pipe line. This protective voltage is compensated for by closing the normally open bias adjustment switch 46 to be closed or on position. This electrically connects one half of the power source 45 thru microammeter 38 via a 22,000 ohm resistor and a variable portion of potentiometer 44. Potentiometer 44 is adjusted to zero microammeter 38 and this counteracts and eliminates the effect of the protective voltage on the pipe string. When switch 37A and B is closed, the pipe string is charged via 37A and the adjusted bias potential is applied to microammeter 38 via switch 37B. When switch 37 is placed to the test position, the bias potential is still applied to the microammeter via switch 37B and simultaneously, the residual charge on the pipe line elements is placed across microammeter 38.

A second double-pole double-throw toggle switch with a center, neutral position is mechanically coupled to switch 37. This switch, 47A and B, couples a charge and discharge timer to the circuit to provide measurable parameters that may be recorded to provide an historic profile of the condition of the insulator being tested. When the system is placed in the charge position and 37A applies a potential to the pipe string, the same potential is applied via switch 47A thru resistor 48 and transistor amplifier 49 to a charge timer and indicator 50. This device measures the time that the switches are closed and displays the total elapsed charging time once charging has ceased as a function of opening switches 37 and 47. When switches 37 and 47 are placed in the test position, switch 47B closes and electrically connects discharge timer 60 to the discharge path including microammeter 38. A zener diode 51 is connected between the discharge timer 60 and the microammeter 38 circuit so that the discharge timer will respond to current flow only when the voltage on the line is above a predetermined value. The output of zener diode 51 is coupled via resistor 58 and transistor amplifier 59 to the discharge timer and indicator 60 in exactly the same fashion as that utilized for the charge timer and indicator. Both the charge timer and indicator and discharge timer and indicator may be identical devices and any voltage responsive timer may be used. However, for purposes of explanation, a digital timer and indicator system is discussed herein and presented in FIG. 4.

Figure 4:
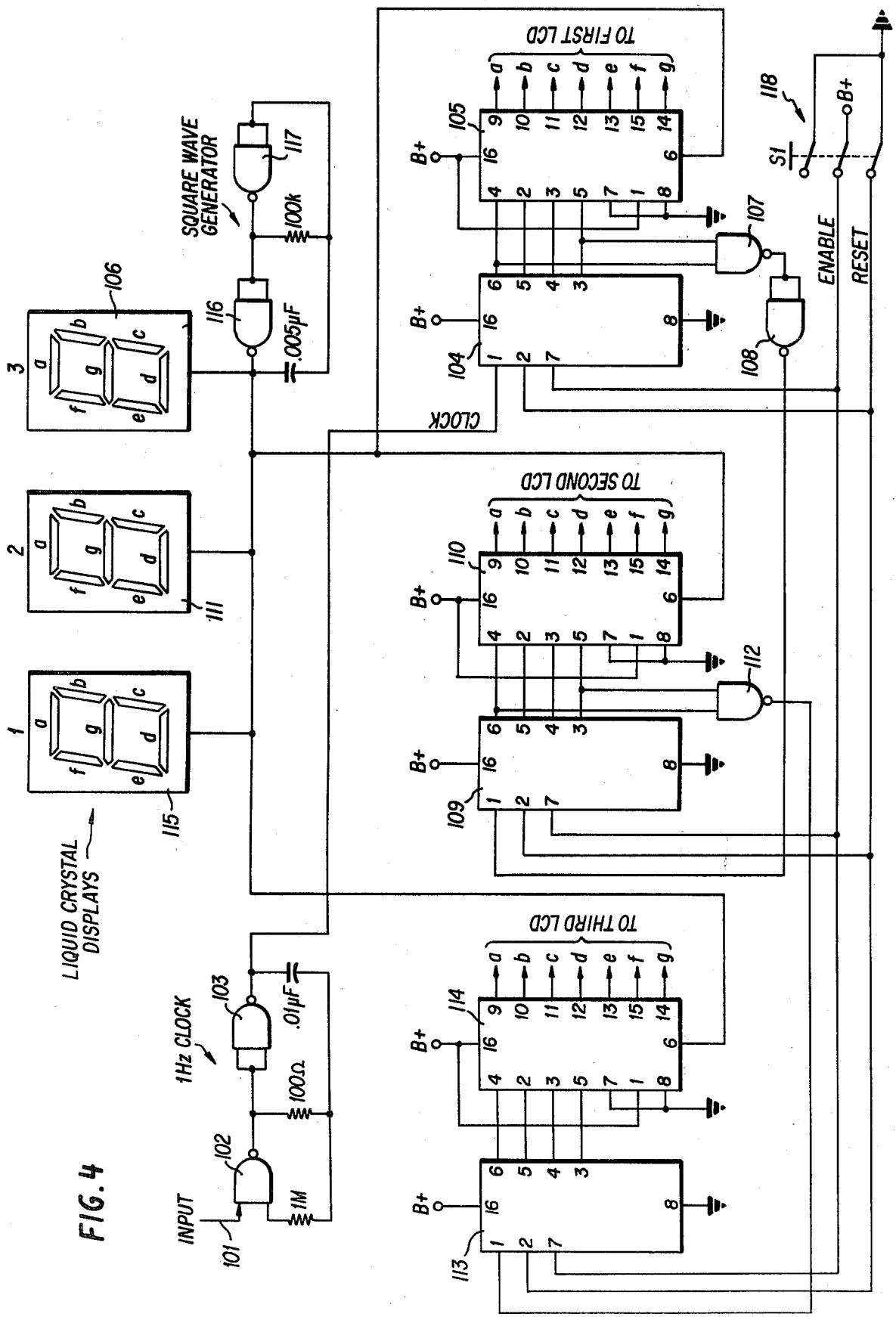
FIG. 4 is a schematic diagram of one of the timer units.

The typical timer circuit illustrated in FIG. 4 utilizes a 9 volt power source which is also used in FIG. 3 to provide a circuit check voltage. This common power source, 65 of FIG. 1 is coupled via a signal lamp 66 to test lead 33 and to test lead 34 via a push-button test switch 67. Thus the electrical contacts between test leads 33 and 34 and the pipe string may be tested to indicate if the short indication provided by microammeter 38 during a test was truely caused by a short between the two pipe elements. If the insulation between the two pipe elements is shorted, depressing the test push-button switch 67 will cause current to flow thru the shorted insulator and the signal lamp will be illuminated. If the faulty test indicated by microammeter 38 was caused by an open in the electrical circuit between the test leads 33 and 34 and pipe elements, pressing the push-button 67 will indicate that an open circuit is present and the signal lamp will not be illuminated thus indicating that the pipe string could not be accurately tested due to an improper electrical connection in the test system.

FIG. 4 is a timer and display circuit such as might be used for charge timer and indicator 50 or discharge timer and indicator 60. This is a digital timing circuit incorporating a means to drive a liquid crystal display. In operation, an input from either amplifier 49 or 59 of FIG. 3 is applied to input 101 of FIG. 4 as a high or enabling potential. This causes the 1 Hz clock comprised of NAND gates 102 and 103 and associated RC components to produce a clock train which clocks counter 104. Counter 104 is a dual BCD up counter which is electrically connected to decoder driver 105 in a fashion which will cause the decoder driver 105 to activate liquid crystal display 106 to indicate hundredths of a minute. NAND gates 107 and 108 form a decoder which provides a clock output for counter 109. This counter is also a dual BCD up counter and it is incremented every one tenth of a second by the output of inverter 108.

Counter 109 is coupled to decoder/driver 110 and it is electrically connected to liquid crystal display 111 in such a manner that the liquid crystal display is caused to change each one tenth of a second to indicate the elapsed time in tenths of a second.

NAND gate 112 acts as a decoder for the output of counter 109 to provide an incrementing clock pulse to counter 113. Counter 113 is also a dual BCD up counter and it is electrically connected to decoder/driver 114. Decoder/driver 114 is electrically connected to liquid crystal display 115 in such a manner as to cause this liquid crystal display to indicate elapsed time in minutes.

In the exemplary counter/display embodiment of FIG. 4, counters 104, 109, and 113 may be provided by type 4518 integrated circuits and the seven segment latch/decoder/drivers 105, 110, and 114 may be provided by type 4543 integrated circuits. The two input NAND gates 102, 103, 107, 108, 112, 116, and 117 may be provided by an integrated circuit such as a 4011.

Synchronizing and strobing of the liquid crystal displays and decoders of FIG. 4 is provided by a square wave generator comprised of two input NAND gates 116 and 117 and the associated RC components. Resetting of the display is provided by a reset/enable switch 118 which places a high on the enable inputs of counters 104, 109, and 113 during normal operation and a high on the reset inputs of those counters when resetting is desired.

While preferred embodiments of this invention have been illustrated and described, variations and modifications may be apparent to those skilled in the art. Therefore, I do not wish to be limited thereto and ask that the scope and breadth of this invention be determined from the claims which follow rather than the above description.

What I claim is:

1. An insulation testing apparatus, comprising:
    means for applying a direct current electrical potential to electrical conductors separated by an electrical insulator to be tested, said direct current electrical potential being of opposite polarity on opposite sides of said insulator;
    means for interrupting said application of said direct current electrical potential; and means for measuring residual electrical charge differential between said electrical conductors after interruption of said application of direct current electrical potential.

2. An apparatus as defined in claim 1 wherein said residual electrical charge on said electrical connectors is electrolytic and a function of an electrolyte bridging said electrical conductors and said insulator.

3. An apparatus as defined in claim 2, further comprising:
    means for measuring the time duration of the application of said DC current electrical potential to said electrical conductors.

4. An apparatus as defined in claim 3, further comprising:
    means for measuring the time required for said residual electrical charge to dissipate to a predetermined value.

5. An apparatus as defined in claim 4 wherein said means for measuring said residual electrical charge includes a microammeter.

6. An apparatus as defined in claim 5, wherein said means to measure the time duration of direct current application and residual electrical charge dissipation are first and second digital timers incorporating first and second digital display means.

7. An apparatus as defined in claim 5, further including:
    switch means mechanically activated by said means for applying a direct current electrical potential to said electrical conductors and said means for interrupting said application of direct current electrical potential for electrically connecting an auxiliary electrical circuit across said electrical conductors separated by said electrical insulator; a signal lamp means in said auxiliary electrical circuit;
    a DC power source in said auxiliary electrical circuit; and
    a push-button switch means for electrically completing said auxiliary electrical circuit.

8. An apparatus as defined in claim 5, further comprising:
    a meter bias DC power source; and
    a potentiometer means for selectively applying a variable potential from said bias source to said microammeter for compensating for the effects of cathodic protective potentials applied to said electrical conductors.

9. An apparatus as defined in claim 6, further comprising:
 a zener diode electrically connected between said timer unit measuring the discharge time of said residual electrical charge and one of said electrical conductors for stopping the advancement of said timer unit when the potential on said electrical conductor reaches a predetermined value.

10. An apparatus as defined in claim 1, wherein said means for applying a direct current electrical potential to electrical conductors and said means for interrupting said application of direct current electrical potential comprises a multiple pole, multiple throw toggle switch.

* * * * *